United States Patent
Sanjeevarao et al.

(10) Patent No.: US 11,250,898 B2
(45) Date of Patent: Feb. 15, 2022

(54) NON-VOLATILE MEMORY WITH MULTIPLEXER TRANSISTOR REGULATOR CIRCUIT

(71) Applicant: NXP USA, INC., Austin, TX (US)

(72) Inventors: Padmaraj Sanjeevarao, Austin, TX (US); Jacob T. Williams, Austin, TX (US); Karthik Ramanan, Austin, TX (US); Jon Scott Choy, Austin, TX (US)

(73) Assignee: NXP USA, INC., Austin, TX (US)

( * ) Notice: Subject to any disclaimer, the term of this patent is extended or adjusted under 35 U.S.C. 154(b) by 0 days.

(21) Appl. No.: 16/845,315

(22) Filed: Apr. 10, 2020

(65) Prior Publication Data

US 2021/0319819 A1 Oct. 14, 2021

(51) Int. Cl.
*G11C 11/00* (2006.01)
*G11C 11/16* (2006.01)

(52) U.S. Cl.
CPC ...... *G11C 11/1655* (2013.01); *G11C 11/1659* (2013.01); *G11C 11/1673* (2013.01); *G11C 11/1675* (2013.01); *G11C 11/1697* (2013.01)

(58) Field of Classification Search
CPC ............ G11C 11/1655; G11C 11/1673; G11C 11/1697; G11C 11/1675; G11C 11/1659
See application file for complete search history.

(56) References Cited

U.S. PATENT DOCUMENTS

| | | | |
|---|---|---|---|
| 2009/0091969 A1* | 4/2009 | Ueda | G11C 13/00 365/148 |
| 2009/0231318 A1 | 9/2009 | Lee | |
| 2010/0014345 A1 | 1/2010 | Choi et al. | |
| 2010/0073992 A1* | 3/2010 | Ueda | G11C 11/1653 365/148 |
| 2011/0275334 A1* | 11/2011 | Parker | H04B 1/0458 455/127.1 |
| 2014/0092665 A1* | 4/2014 | Ueda | H01L 27/0207 365/63 |
| 2017/0069380 A1* | 3/2017 | Takahashi | G11C 11/1675 |
| 2017/0092347 A1 | 3/2017 | Gogl et al. | |
| 2017/0263299 A1* | 9/2017 | Takizawa | G11C 11/1673 |

* cited by examiner

*Primary Examiner* — Uyen Smet
(74) *Attorney, Agent, or Firm* — David G. Dolezal (57) ABSTRACT

As disclosed herein, a memory includes an array of resistive memory cells and a voltage regulator circuit that provides a regulated voltage based on a circuit with a replica resistive storage element. The regulated voltage is applied to a mux transistor of a multiplexer of a column decoder that is used to select a particular column line of a memory array from a set of column lines to provide the proper voltage to the memory cell during a write operation to the memory cell.

18 Claims, 9 Drawing Sheets

FIG. 9

NON-VOLATILE MEMORY WITH MULTIPLEXER TRANSISTOR REGULATOR CIRCUIT

BACKGROUND OF THE INVENTION

Field of the Invention

This invention relates to non-volatile memories.

Background

Non-volatile memories are utilized for storing data in an electronic system including when the system is powered down. One type of non-volatile memory is a resistive memory, in which each bit cell of a resistive memory includes a resistive storage element which is in either a high resistive state (HRS) or a low resistive state (LRS), depending on the logic state of the bit cell. In some embodiments, for a write operation of a bit cell of a resistive memory, a write current is provided in a first direction through the resistive storage element to place it in the HRS, and a write current is provided in a second and opposite direction through the resistive storage element to place it in the LRS.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

The use of the same reference symbols in different drawings indicates identical items unless otherwise noted. The Figures are not necessarily drawn to scale.

DETAILED DESCRIPTION

The following sets forth a detailed description of a mode for carrying out the invention. The description is intended to be illustrative of the invention and should not be taken to be limiting.

As disclosed herein, a memory includes an array of resistive memory cells and a voltage regulator circuit that provides a regulated voltage based on a circuit with a replica resistive storage element. The regulated voltage is applied to a mux transistor of a multiplexer of a column decoder that is used to select a particular column line of a memory array from a set of column lines to provide the proper voltage to the memory cell during a write operation to the memory cell.

In some embodiments, it may be desirable to optimize write currents for writing to a resistive memory cell across temperature, process, and voltage variations so as to ensure, for example, that the proper write current is used, which is large enough to be effective to change the resistive state but not so large so as to damage the resistive storage element. As will be described in more detail below, a voltage provided by the multiplexer regulator circuit may in some embodiments, ensure that the proper write currents are provided across temperature, process, and voltage variations while reducing the number of transistors of a memory.

Figure 1:
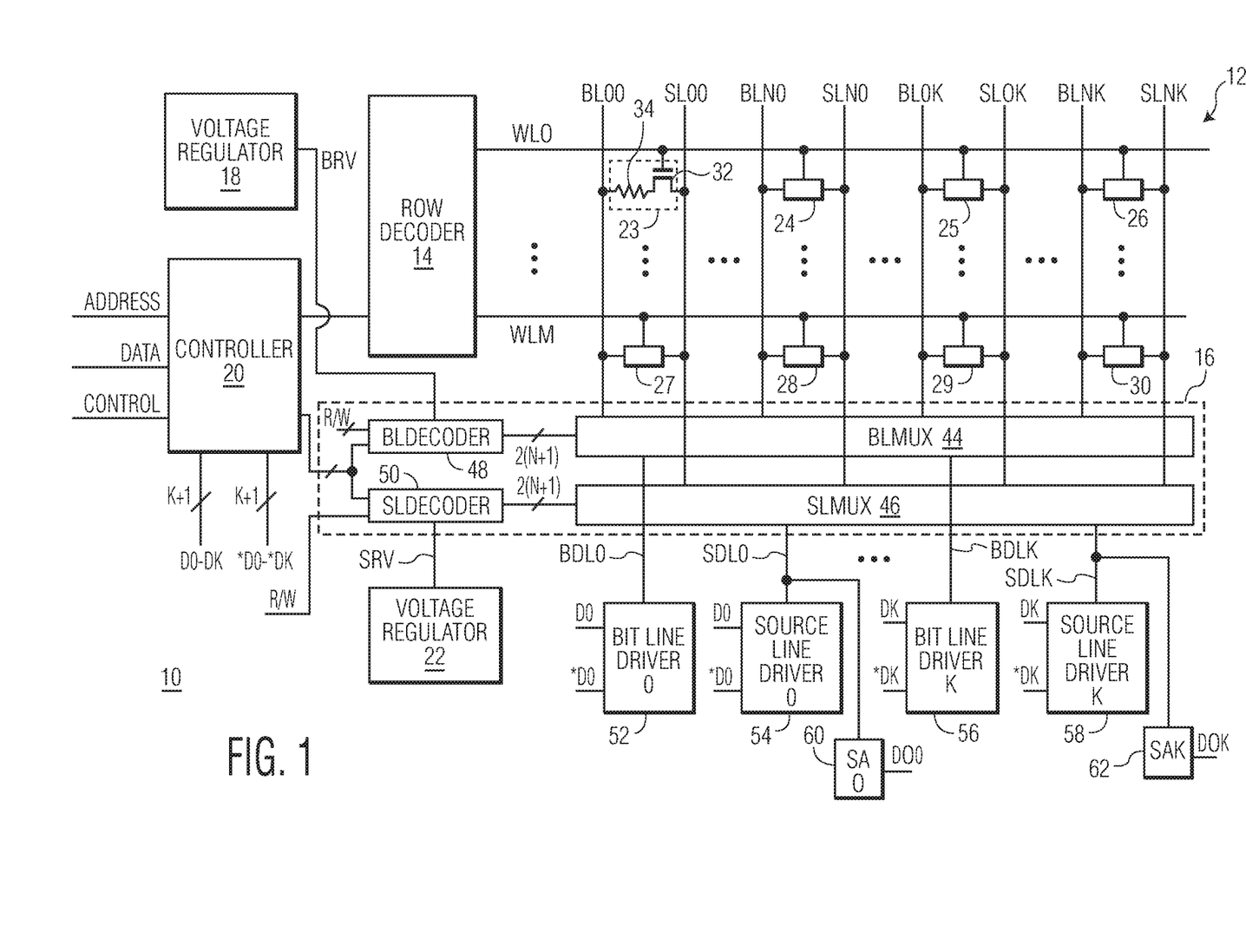
FIG. 1 is a circuit diagram of a non-volatile memory circuit according to one embodiment of the present invention.

FIG. 1 shows a circuit diagram of a non-volatile memory circuit 10 according to one embodiment of the present invention. Memory circuit 10 includes an array 12 of non-volatile memory cells (e.g. 23-30). In one embodiment, the memory cells of array 12 are characterized as resistive memory cells with a select transistor (e.g. 32) and a resistive storage element (e.g. 34). Types of resistive memory cells include, for example, MRAM, ReRAM, carbon nanotube, and phase change memory cells. In some embodiments, these resistive memory cells may be implemented by a magnetic tunnel junction (MTJ), therefore, each bit cell may be described as including a select transistor (e.g. 32) and an MTJ (e.g. 34). Note that in the illustrated embodiments, the select gate transistors are N-type metal-oxide-semiconductor (NMOS) transistors. However, other types of resistive memory cells may have other configurations and/or may be implemented with other types of resistive storage structures. In some embodiments, memory circuit 10 may be coupled to a processor circuit (not shown) of an electronic system that provides data to be written in the memory and receives the read data from the memory.

The memory cells of array 12 are arranged in rows and columns. Each cell of a row is coupled to a corresponding word line of WL0-WLM for controlling the select transistor (e.g. 32) of the cell to access the resistive storage element (e.g. 34) of the cell during a memory operation. The word lines are controlled by a row decoder 14 which asserts a selected one of the word lines based on a first portion of an address received by a controller 20 of memory circuit 10 for the memory operation. Array 12 includes M+1 number of rows with 2 rows being shown in FIG. 1. However, an array may include a different number of rows in other embodiments. For example, an 8Mb memory array may have 2048 rows plus a few (e.g., 2 or 4) redundant rows.

In the embodiment shown, the cells of each column of array 12 are coupled to a corresponding source line of SL00-SLNK and a corresponding bit line of BL00-BLNK. Array 12 includes (N+1)(K+1) source lines and (N+1)(K+1) bit lines, in which FIG. 1 illustrates four source lines (e.g. SL00, SLN0, SL0K, and SLNK) and four bit lines (e.g. BL00, BLN0, BL0K, and BLNK). However, array 12 may have a different number of columns in other embodiments.

(e.g. 64*(N+1)). In other embodiments, each column of an array may include a source line paired with two bit lines, a single bit line, or different combinations of bit lines and source lines. As described herein, a "column line" may refer to either a source line or a bit line.

In the embodiment shown, memory circuit 10 includes a column decoder 16 for selecting a subset of the bit lines and source lines (SL00-SLNK, BL00-BLNK) to provide to write circuitry (bit line driver circuits 52 and 56 and source line driver circuits 54 and 58) during a memory write operation and to provide to sense amplifiers (60 and 62) during a memory read operation. In the embodiment shown, the column decoder 16 includes a bit line multiplexer 44 for selecting a subset of the bit lines (BL00-BLNK) and source line multiplexer 46 for selecting a subset of the source lines (SL00-SLNK) during a memory operation. The control inputs for bit line multiplexer 44 are provided by a bit line decoder 48. The control inputs for the source line multiplexer 46 are provided by source line decoder 48. The control signals from decoders 48 and 50 are based on a second portion of the ADDRESS received by controller 20, which provides the second address portions to decoders 48 and 50. In one embodiment, the control signals provided by bit line decoder 48 are also based on the read/write signal (R/W). In other embodiments, the control signals provided by the source line decoder 50 is also based on the read/write signal.

The column decoder 16 selects K+1 number of selected bit lines and selected source lines from a total number of (K+1)(N+1) bit lines and source lines of array 12 based on a second portion of the ADDRESS received by controller 20 for the memory operation. In some embodiments, K+1 represents the size of the data unit (e.g. 8, 16, 32, 64 bits) being written to or read from memory array 12 during a memory operation. In other embodiments, K+1 may include multiple data units (e.g. 128 bits, 256 bits) in a row. N+1 represents the decode ratio (e.g. 4 to 1, 8 to 1, 16 to 1) of column decoder 16.

Figure 4:
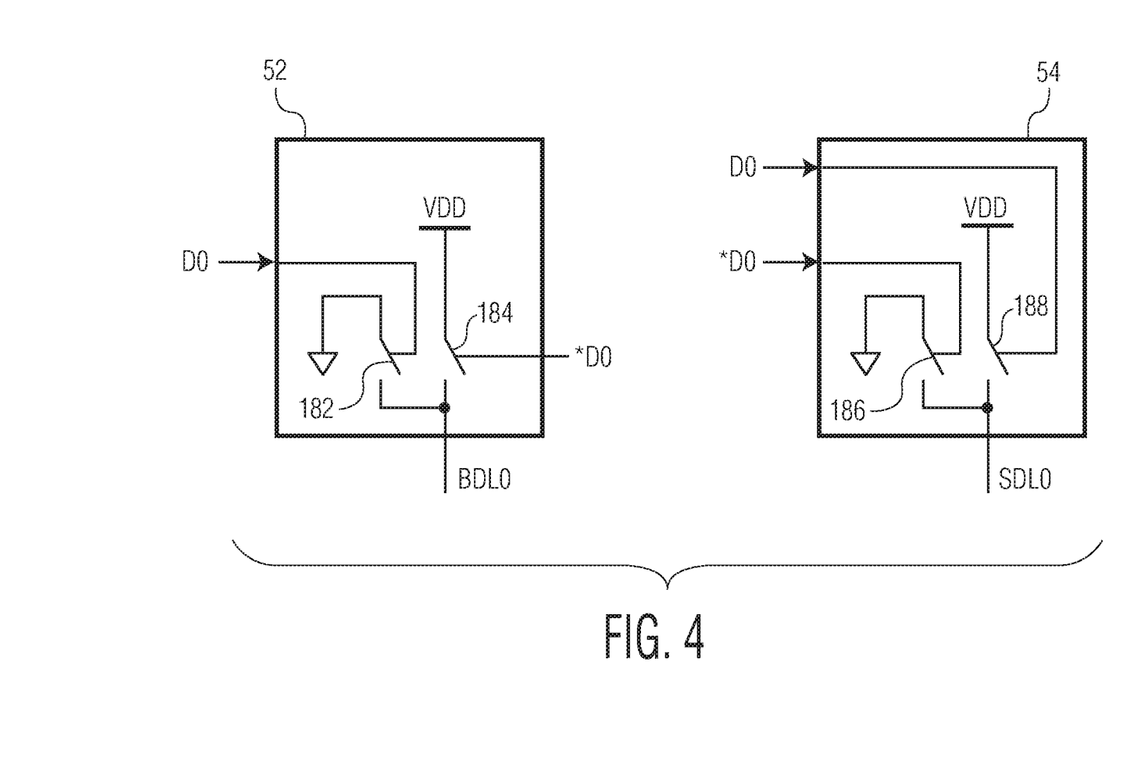
FIG. 4 is a circuit diagram of write driver circuits of the non-volatile memory circuit of FIG. 1, according to one embodiment of the present invention.

During a write operation, the selected source lines are coupled to source line driver circuits (54, 58) via mux transistors (not shown in FIG. 1) in source line multiplexer 46 and via source data lines (SDL0, SDLK). The selected bit lines are coupled to bit line driver circuits 52 and 56 via mux transistors (not shown in FIG. 1) in bit line multiplexer 44 and via bit data lines (BDL0, BDLK). In one embodiment, during a write operation to a bit cell of a column, bit line driver (e.g. 52) couples the bit line (e.g. BL00) of the column to one write voltage of either VDD or VSS and a source line driver (e.g. 54) couples the source line (e.g. SL00) of the column to the other write voltage of VDD or VSS, depending on the data value being written as determined by the data lines (D0-DK) and complementary data lines (*D0-*DK) (see the discussion of 4). During the write operation, the select transistor (e.g. 23) is made conductive by assertion of the appropriate word line to provide a voltage differential across the resistive storage element (e.g. 34) whose polarity determines whether a 1 or 0 is written to the cell.

In the embodiment shown, during a read operation, the selected source lines are provided to sense amplifiers 60 and 62 via mux transistors (not shown in FIG. 1) in source line multiplexer 46 and via the source data lines (SDL0, SDLK). Each sense amplifier provides a read value from the cell to a data line (D0-DK).

Figure 5:
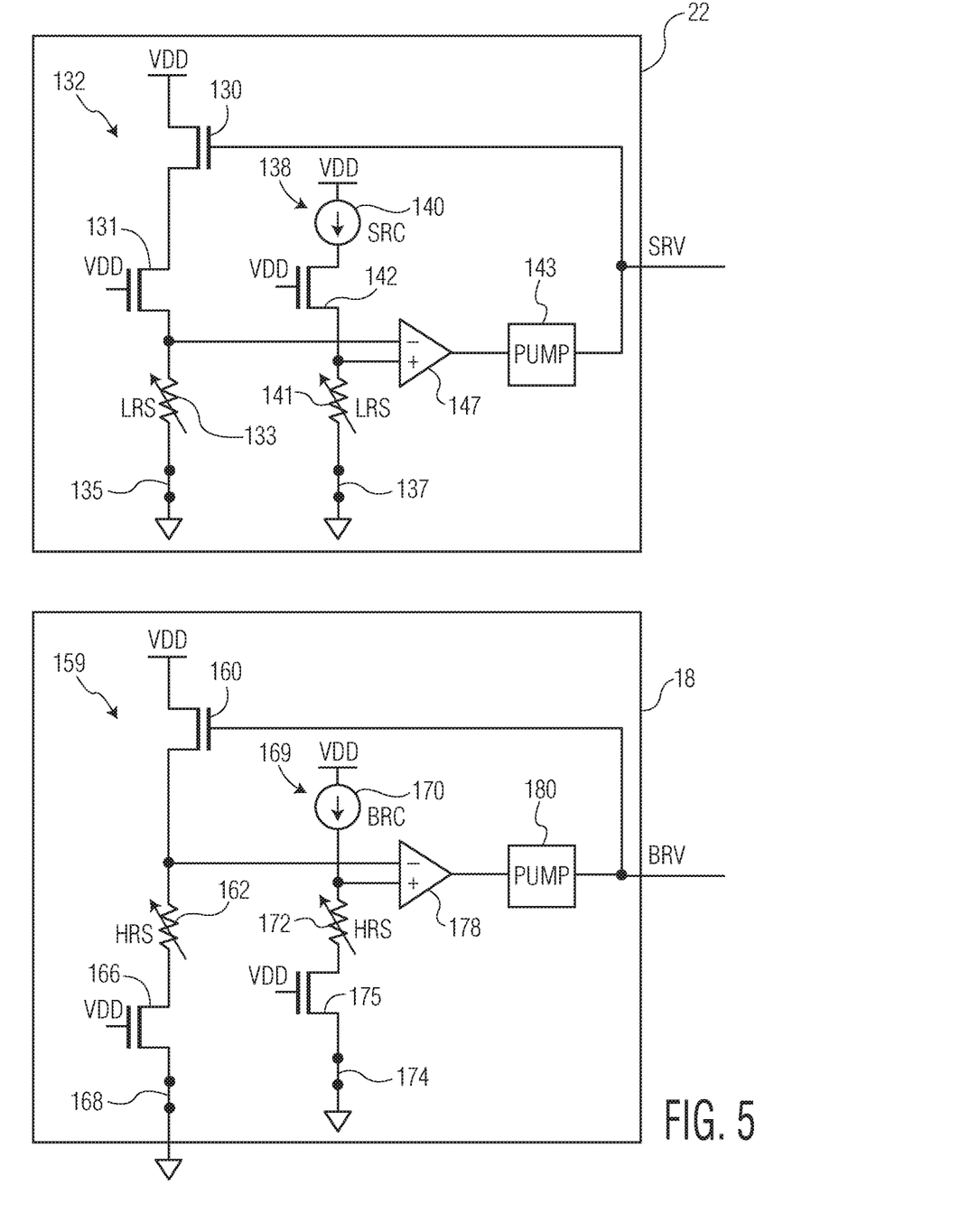
FIG. 5 is a circuit diagram of voltage regulator circuits of the non-volatile memory circuit of FIG. 1, according to one embodiment of the present invention.

Memory circuit 10 includes a voltage regulator 18 for providing a regulated voltage BRV to bit line decoder 48 in which decoder 48 provides as a high state voltage for at least some of the control signals provided to bit line multiplexer 44. Memory circuit 10 includes a voltage regulator 22 for providing a regulated voltage SRV to source line decoder 50 in which decoder 50 provides as a high state voltage for at least some of the control signals provided to source line multiplexer 46. As shown in FIG. 5, each of these regulators includes a memory cell replica circuit to regulate the voltage to account for variability of the cells to ensure that the proper write currents are provided across temperature, process, and voltage variations.

Figure 2:
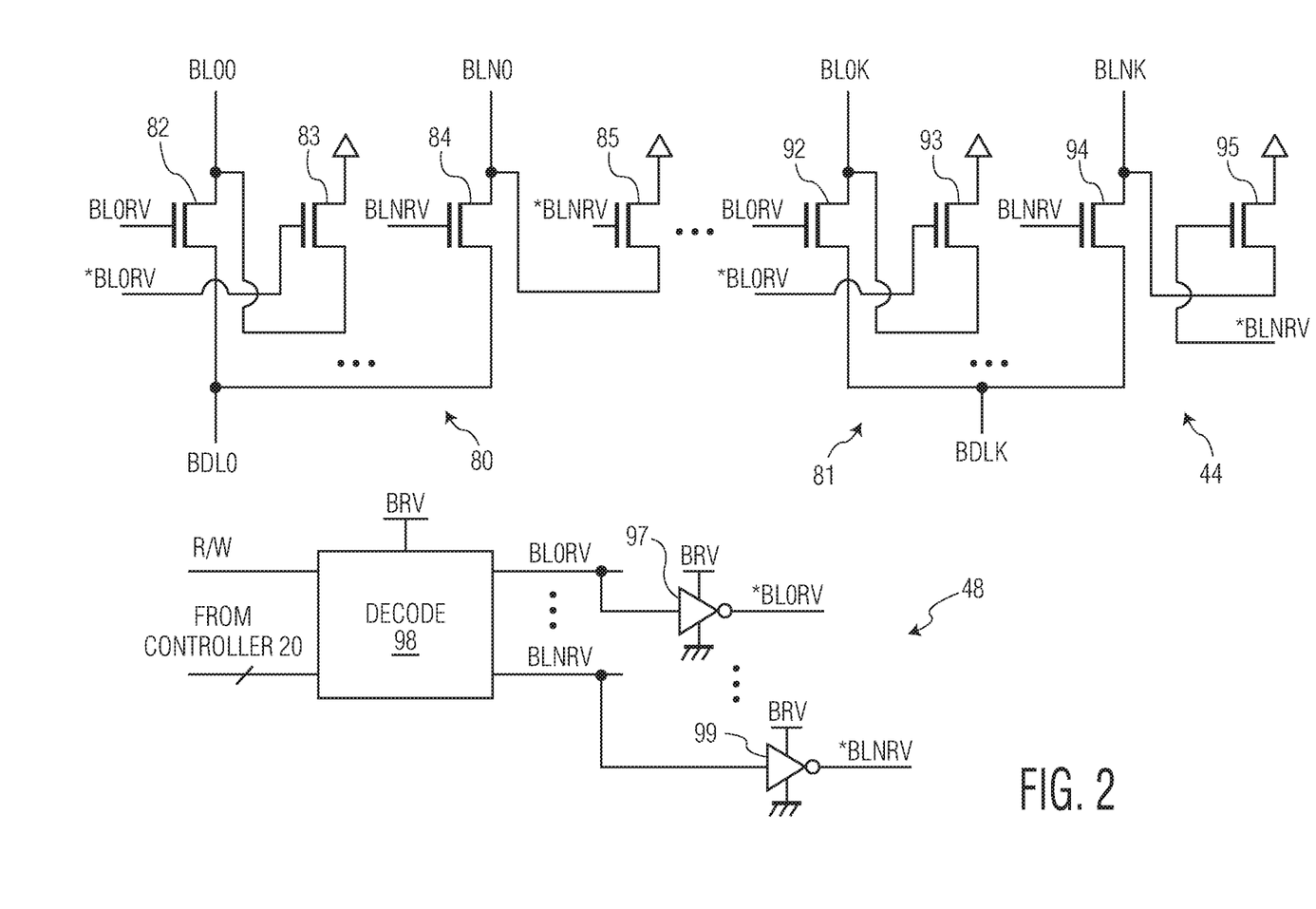
FIG. 2 is a circuit diagram of a bit line decoder and bit line multiplexer of the non-volatile memory circuit of FIG. 1, according to one embodiment of the present invention.

FIG. 2 is a circuit diagram that shows a portion of bit line decoder 48 and bit line multiplexer 44. Multiplexer 44 includes a K+1 number of bit line multiplexer circuits (80,81) for coupling one of a set of bit lines (e.g. BL00-BLN0) to a bit data line (e.g. BDL0) during a memory write operation. In the embodiment shown, each multiplexer circuit (e.g. 80) includes 2*(N+1) mux transistors. The mux transistors of each multiplexer circuit (e.g. 80) include a coupling transistor (e.g. 82, 84) for each bit line (BL00, BLN0, respectively) for coupling the selected bit line to the bit data line (BDL0) during a memory write operation. Each multiplexer circuit (e.g. 80) also includes a grounding transistor (e.g. 83, 85) for each bit line (BL00, BLN0, respectively) for coupling an unselected bit line to ground during a memory operation. Multiplexer circuit 81 includes coupling transistors 92 and 94 and grounding transistors 93 and 95.

The gates (control electrodes of a FET) of the coupling transistors (82, 84, 92, and 94) are controlled by control signals (BL0RV-BLNRV). Each control signal (BL0RV-BLNRV) is asserted to couple the selected one set of K+1 bit lines to the K+1 bit data lines (BDL0-BDLK) with one bit line for each multiplexer circuit (80, 81) being coupled to the respective bit data line (BDL0, BDLK) during memory write operation. The gates of grounding transistors (83, 85, 93, and 95) are controlled by complementary control signals (*BL0RV-*BLNRV). Each complementary control signal (*BL0RV-*BLNRV) is asserted to couple the unselected bit lines to ground during a memory operation. During a memory write operation, for each multiplexer circuit (80, 81), K bit lines would be unselected and would be coupled to ground.

Bit line decoder 48 includes decode circuit 98 that produces the control signals (BL0RV-BLNRV) based on a portion of the memory address received from controller 20 and from the R/W signal. Decoder 48 includes inverters (97, 99) for inverting the control signals (BL0RV-BLNRV) to provide the complementary control signals (*BL0RV-*BLNRV). Decode circuit 98 receives the BRV voltage from regulator 18, wherein a high state voltage of the control signals (BL0RV-BLNRV) is BRV to control the write conditions of a bit line during a write operation. In the embodiment shown, the high supply voltage terminal of each inverter (97, 99) receives the regulated voltage BRV from regulator 18 such that the high state voltage of the complementary control signal (*BL0RV-*BLNRV) is regulated. However, in other embodiments, the high state voltage of the complementary control signals (*BL0RV-*BLNRV) is VDD, wherein VDD would be provided to the high supply voltage terminal.

In the embodiment shown, during a read operation, all of the complementary control signals (*BL0RV-*BLNRV) are at a high state voltage to make conductive all of the grounding transistors (83, 85, 93, and 95) to couple all of the bit lines to ground. In the embodiment shown, the bit lines are not coupled to the sense amplifiers (60, 62) during a read operation.

Figure 3:
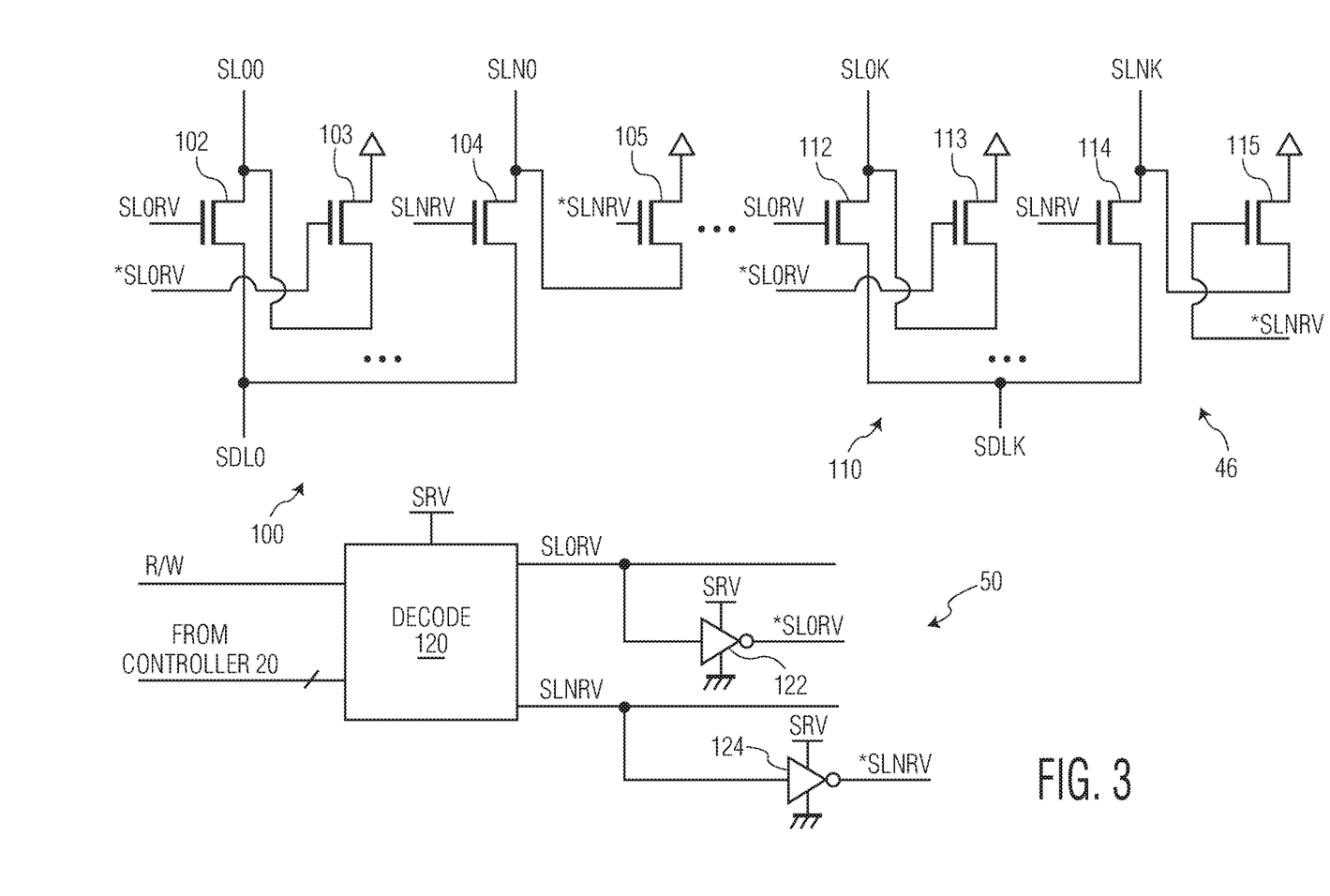
FIG. 3 is a circuit diagram of a source line decoder and source line multiplexer of the non-volatile memory circuit of FIG. 1, according to one embodiment of the present invention.

FIG. 3 is a circuit diagram that shows a portion of source line decoder 50 and source line multiplexer 46. Multiplexer 46 includes a K+1 number of source line multiplexer circuits (100, 110) for coupling one of a set of source lines (e.g. SL00-SLN0) to a source data line (e.g. SDL0) during a memory operation. In the embodiment shown, each multiplexer circuit (e.g. 100) includes 2*(N+1) mux transistors. The mux transistors of each multiplexer circuit (e.g. 100) include a coupling transistor (e.g. 102, 104) for each source line (SL00, SLN0, respectively) for coupling the selected source line to the source data line (SDL0) during a memory operation (read or write). Each multiplexer circuit (e.g. 100) also includes a grounding transistor (e.g. 103, 105) for each source line (SL00, SLN0, respectively) for coupling the unselected source lines to ground during a memory operation. Multiplexer circuit 110 includes coupling transistors 112 and 114 and grounding transistors 113 and 115.

The gates of coupling transistors (102, 104, 112, and 114) are controlled by control signals (SL0RV-SLNRV). Each control signal (SL0RV-SLNRV) is asserted to couple a one selected set of K+1 source lines to the K+1 data lines (SDL0-SDLK) with one source line for each multiplexer circuit (100, 110) being coupled to the respective source data line (SDL0, SDLK) of the multiplexer circuit during memory operation. The gates of grounding transistors (103, 105, 113, and 115) are controlled by complementary control signals (*SL0RV-*SLNRV). Each complementary control signal (*SL0RV-*SLNRV) is asserted to couple the unselected source lines to ground during a memory operation. During a memory operation, for each multiplexer circuit (100,110), K source lines would be unselected and would be coupled to ground.

Source line decoder 50 includes decode circuit 120 that produces the control signals (SL0RV-SLNRV) based on a portion of the memory address received from controller 20. Decode circuit 120 receives the SRV voltage where the high state voltage of the control signals (SL0RV-SLNRV) is SRV. Decoder 50 includes inverters (122, 124) for inverting the control signals (SL0RV-SLNRV) to provide the complementary control signals (*SL0RV-*SLNRV). The high supply voltage terminal of each inverter (122, 124) receives the regulated voltage SRV from regulator 22 such that the high state voltage of the control signal (*SL0RV-*SLNRV) is SRV. In other embodiments, the high state voltage of the complementary control signals (*SL0RV-*SLNRV) is VDD.

FIG. 4 is a circuit diagram of bit line driver circuit 52 and source line driver circuit 54. Other bit line driver circuits (56) and source line driver circuits (58) are configured accordingly. Driver circuit 52 includes a grounding switch 182 for coupling the bit data line (BDL0) to ground and a switch 184 for coupling bit data line (BDL0) to a write voltage of VDD during a data write to a selected memory cell of the bit line, depending on the value of the data signal D0 and complementary data signal *D0, which control the conductively of the switches respectively. When D0 is high and *D0 is low, switch 182 is closed and switch 184 is open such that bit data line BDL0 is grounded. When D0 is low and *D0 is high, switch 182 is open and switch 184 is closed to pull bit data line BDL0 to the high write voltage VDD.

Driver circuit 54 includes a grounding switch 186 for coupling the source data line (SDL0) to ground and a switch 188 for coupling source data line (SDL0) to a write voltage of VDD during a data write to a selected memory cell, depending on the value of the complementary data signal *D0 and the data signal D0, which control the conductively of the switches respectively. When *D0 is high and D0 is low, switch 186 is closed and switch 188 is open such that source data line SDL0 is grounded. When *D0 is low and D0 is high, switch 186 is open and switch 188 is closed to pull source data line SDL0 to the high write voltage VDD.

Thus, when data signal D0 is high and the complementary data signal *D0 is low, the bit data line (BDL0) is grounded and the source data line (SDL0) is pulled to VDD to write a "1" value to the selected memory cell coupled between the source data line and bit data line during a write operation. When data signal D0 is low and the complementary data signal *D0 is high, the bit data line (BDL0) is pulled to VDD and the source data line (SDL0) is grounded to write a "0" value to the selected memory cell coupled between the source data line and bit data line during a memory write operation. In some embodiments, the switches are implemented with NMOSFETs but may be implemented with other types of switches (e.g. pass gates) in other embodiments.

FIG. 5 is a circuit diagram of one embodiment of voltage regulator 22 and voltage regulator 18. Regulator 22 provides regulated voltage SRV and regulator 18 provides regulated voltage BRV. Regulator 22 includes a write replica path 132 that includes a control transistor 130, a replica select transistor 131, a replica resistance storage element 133, and closed switch 135. In one embodiment, transistor 130 is sized to replicate a coupling transistor (e.g. 102) in a source multiplexer 46. In one embodiment, replica resistive storage element 133 has a resistance value that is equivalent to a resistive storage element (34) in a Low Resistance State (LRS) indicative of a first value ("0") being stored in a resistive storage element (e.g. 34). In one embodiment, transistor 131 is sized to replicate a select transistor (32) of a cell. Closed switch 135 is sized to replicate a coupling transistor (e.g. 82) of bit line multiplexer 44. A write replica circuit is a circuit that includes at least a replica resistive storage element whose resistance is equivalent (equal or nearly equivalent) or proportional to the memory storage element at a particular resistive value. In some embodiments, the replica resistive storage element is implemented with trimmable resistor. In other embodiments the replica resistive storage element may be implemented with a single resistor or multiple resistors to provide the appropriate resistance. In some embodiments, the replica resistive storage element may be the same type of resistive storage element as the resistive storage elements (34) of array 12 (e.g. an MTJ). In one embodiment where the replica resistive storage element is the same type as the resistive storage elements of array 12, the replica resistive storage element is programmed to be at a particular resistive state (e.g. either LRS or HRS). In some embodiments, the replica resistive storage element may be implemented with multiple resistive storage elements of the same type as in array 12, where the multiple resistive storage elements are arranged to provide a value to compensate for manufacturing or temperature variations of a single resistive storage element.

In the embodiment shown, regulator 22 includes a current reference path 138 that includes a reference current source 140 for providing a reference current value (SRC) for changing the resistance state of a memory cell from an LRS to a High Resistance State (HRS) to write a "1" to a memory cell. Current reference path 138 includes a replica resistance storage element 141 that has a resistive value equivalent to a resistive storage element (34) in a Low Resistance State (LRS), transistor 142 which replicates select transistor 131, and closed switch 137 which replicates a coupling transistor (e.g. 82) of bit line multiplexor 44. In one embodiment, both of replica resistive storage elements 133 and 141 are poly resistors. By using poly resistors to replicate as the replica resistive storage elements, the same process, voltage, and temperature variation effects on the reference cells will also affect the replica resistive storage elements 133 and 141. In some embodiments, the replica circuit and thus SRV may match the write path parasitics and the temperature coefficient of the resistive storage elements (e.g. 34) of the memory cells.

In the embodiment shown, regulator 22 includes a comparator 142 and charge pump 143. The inverting input (−) of comparator 142 is coupled to a node of the write replica path 132 and the non-inverting input (+) is coupled to a node of the current reference path 138. During operation, if its non-inverting input is higher than its inverting input, comparator 142 outputs a high voltage to charge pump 143 which turns on charge pump 143 to increase the voltage SRV which increases the conductivity of transistor 130 to increase the current through the write replica path 132 to match the SRC current from current source 140, as indicated when the voltage at the inverting input of comparator 142 matches the voltage of the non-inverting input. If its non-inverting input is lower than its inverting input, comparator 142 outputs a low voltage to turn off charge pump 143. In some embodiments, transistor 130 acts as a source follower to regulate the voltage at the node of the inverting input of comparator 142 to match the voltage of the non-inverting input of comparator 142. Comparator 142 and pump 143 may be referred to as a regulator circuit having inputs coupled to each of write replica path 132 and the reference current path 138.

Current source 140 can be controlled and trimmed in some embodiments so as to set a desired or target voltage over resistive element 141 and thus at the non-inverting input of comparator 142. The output of comparator 142 controls pump 143 (by turning it on or off as needed) to provide SRV to the control electrode of transistor 130 thus regulating the voltage at the inverting input of comparator 142 to match the voltage at the non-inverting input of comparator 142. The voltage at the non-inverting input of comparator 142 determines the voltage at the inverting input and thus the current through replica resistive storage element 133, which is set to replicate the LRS of a resistive storage element of a memory cell. In this manner, by setting SRC to a particular current (which may be trimmed per chip through circuit characterization), the target voltage over resistive storage element 133 is set, in which this target voltage also represents the desired or target voltage at a source line side node (see node 202 of FIGS. 6-9) of the resistive storage elements (e.g. 34) of the memory cells during a voltage write of a "1" value. This target voltage at these nodes (e.g. 202), as set by the regulated SRV voltage applied to the gates of coupling transistors (e.g. 102) of source multiplexer 46 for the selected source lines, results in the desired or target programming current through the resistive elements from the corresponding source line to the corresponding bit line for the write operation of a "1" value.

Regulator 18 includes a write replica path 159 that includes a control transistor 160, a replica resistive storage element 162, a replica select transistor 166, and closed switch 168. In one embodiment, transistor 160 is sized to replicate a coupling transistor (e.g. 82) in a bit line multiplexer 44. In one embodiment, replica resistive storage element 162 has a value that is equivalent to a storage element (e.g. 34) in a High Resistance State (LRS) indicative of a value ("1") being stored in a storage element (e.g. 34). In one embodiment, transistor 166 is sized to replicate a select transistor (32) of a cell. Closed switch 168 is sized to replicate a coupling transistor (e.g. 102) of source line multiplexer 46. In one embodiment, resistive elements 162 and 172 are trimmable poly resistors.

In the embodiment shown, regulator 18 includes a current reference path 169 that includes a reference current source 170 for providing a reference current value (BRC) for changing the resistance value of a memory cell from an HRS to an LRS to write a "0" to a memory cell. Current reference path 169 includes a replica resistance storage element 172 that has a resistive value equivalent to a resistive storage element in an HRS, transistor 175 which replicates a select transistor (32), and closed switch 174 which replicates a coupling transistor (e.g. 102) of source multiplexor 46.

In the embodiment shown, regulator 18 includes a comparator 178 and charge pump 180. The inverting input (−) of comparator 178 is coupled to a node of the write replica path 159 and the non-inverting input (+) is coupled to a node of the current reference path 169. During operation, if its non-inverting input is higher than its inverting input, comparator 178 outputs a high voltage to turn on charge pump 180 to increase the voltage BRV which increases the conductivity of transistor 160 to increase the current through the write replica path 159 to match the BRC current from current source 170, as indicated when the voltage at the inverting input of comparator 178 matches the voltage of the non-inverting input. If its non-inverting input is lower than its inverting input, comparator 178 outputs a low voltage to turn off charge pump 180. In some embodiments, transistor 160 acts as a source follower to regulate the voltage at the node of the inverting input of compactor 178 to match the voltage of the non-inverting input of comparator 178.

Current source 170 can be controlled and trimmed in some embodiments so as to set a desired or target voltage over resistive element 171 and thus at the non-inverting input of comparator 178. The output of comparator 178 controls pump 180 (by turning it on or off as needed) to provide BRV to the control electrode of transistor 160 thus regulating the voltage at the inverting input of comparator 178 to match the voltage at the non-inverting input of comparator 178. The voltage at the non-inverting input of comparator 178 determines the voltage at the inverting input and thus the current through replica resistive storage element 162, which is set to replicate the HRS of a resistive storage element of a storage cell. In this manner, by setting BRC to a particular current (which may be trimmed per chip through circuit characterization), the target voltage over resistive element 162 is set, in which the target voltage also represents the desired or target voltage at a bit line side node (see node 200 of FIGS. 6-9) of the resistive elements (e.g. 34) during a write operation of a "0". This target voltage at these nodes (e.g. 200), as set by the regulated BRV applied to the gates of coupling transistors (e.g. 82) of bit line multiplexer 44 for the selected bit lines, results in the desired or target programming current through the resistive elements from the corresponding bit line to the corresponding source line for the write operation of a "0" value.

In one embodiment, charge pumps 143 and 180 may provide voltages that are greater than VDD. For example, in one embodiment where VDD is 1.8V, the charge pumps may provide a voltage up to 3.6 Volts. Also, replica resistive storage elements 133, 141, 162, and 172 may be trimmable, in some embodiments and not in other embodiments.

In other embodiments, a regulator may include other configurations and/or other devices. For example, in embodiments where BRV or SRV does not exceed VDD, the comparator 147 (or 178) and charge pump 143 (or 180) may be replaced with an op amp whose output is connected to the gate of transistor 130 (or 160). Also, in some embodiments, the reference current path 138 (or 169) may be replaced with a reference voltage source. Furthermore, in some embodiment, close switch 135 may be replaced with a transistor whose gate is coupled to receive the BRV voltage and closed switch 168 may be replaced with a transistor whose gate is coupled to receive the SRV voltage. In some embodiments, the voltage regulators 18 and 22 may be configured to provide BRV and SRV, respectively, at voltages VDD when memory array 12 is not being written.

FIGS. 6-9 are circuit diagrams showing the voltage levels of the different signals for performing memory operations with respect to memory cell 23. Memory operations to the other cells of array 12 may be performed in a similar manner. Memory cell 23 includes select transistor 32 whose gate is controlled by word line WL0 and includes a resistive storage element (34) which in the embodiment shown is an MJT of an MRAM cell. Memory cell 23 is coupled to source line SL00 and bit line BL00. Source line SL00 can be tied to source data line SDL0 via a conductive coupling transistor 102 of source multiplexer 46 when the SL0RV signal is at a high regulated voltage of SRV. Source line SL00 can be grounded via a conductive grounding transistor 103 of source multiplexer 46 when signal*SL0RV is at a high voltage value of SRV. Bit line BL00 can be tied to bit data line BDL0 via a conductive coupling transistor 82 of bit line multiplexer 44 when the BL0RV signal is at a high regulated voltage of BRV. Bit line BL00 can be grounded via a conductive grounding transistor 83 of bit line multiplexer 44 when signal *BL0RV is at a high voltage value of BRV. During a memory write, the voltage of source data line SDL0 is controlled by source driver circuit 54 and the voltage of bit data line BDL0 is controlled by bit line driver circuit 52. See FIG. 4.

In one embodiment of a resistive memory array where the memory cells each include an MTJ as the resistive storage element, when current flows through the resistive storage element of a memory cell in a first direction, the memory cell is written to a low resistive state (LRS) in which the magnetic moments of the interacting magnetic layers of the MTJ are aligned in the same direction, and when current flows in a second direction, opposite the first direction, through the resistive storage element, the memory cell is written to a high resistive state (HRS) in which the magnetic moments of the interacting magnetic layers of the MTJ are not aligned in the same direction. In one embodiment, an HRS corresponds to a logic level "1" and an LRS corresponds to a logic level "0". However, in alternate embodiments, the LRS may correspond to the logic level "1" and the HRS to the logic level "0". In one embodiment, the resistance of the HRS is 2-3 times the resistance of the LRS, in which the resistance of the LRS may be in a range of 2 k-8 k Ohms.

Figure 6:
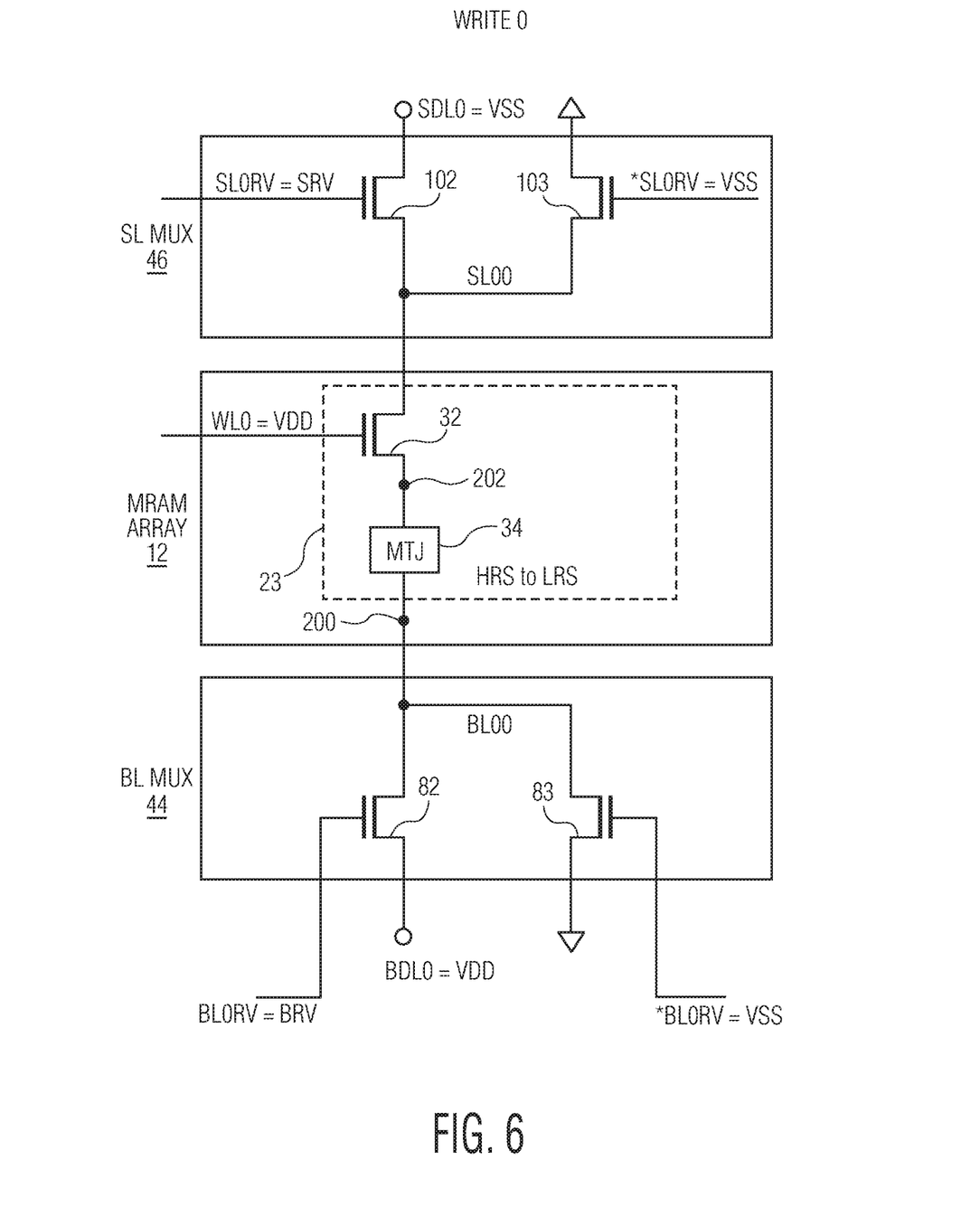
FIG. 6 is a circuit diagram showing voltages applied to nodes during a write operation to a memory cell according to one embodiment of the present invention.

FIG. 6 shows the voltages applied when a "0" is written to memory cell 23, which in the embodiment shown is indicated by the resistive element 34 being in an LRS. In some instances, prior to being written with a "0", resistive element 34 is in an HRS indicating that a "1" is being stored. To write a "0" value to cell 23 from a "1" value, resistive storage element 34 is placed in an LRS from a HRS. In the embodiment shown, to change the resistive state of an MTJ to an LRS, a write current (e.g. of 60 uA) is provided in the "up" direction (relative to the view of FIG. 6) through the MTJ where node 200 is at higher voltage than node 202 to align the magnetic moments of the MTJ of resistive storage element 34. Because the data signal *D0 is at a high value (to indicate that a "0" is to be written), a write voltage of VDD is applied to the bit data line BDLD via a close switch 184 of bit line driver circuit 52 and the source data line SDL0 is grounded by a closed switch 186 of source write driver circuit 54 (See FIG. 4). Control signal SL0RV is at a high regulated voltage to make transistor 102 conductive and select transistor 32 is made conductive by an asserted word line WL0 (at VDD) to pull node 202 towards ground. Signal BL0RV is at a regulated voltage BRV such that transistor 82 acts as a source follower to set the voltage of node 200 at a value to provide a sufficient current to align the magnetic moments of the MJT of storage element 34 to an LSR from an HSR. As stated earlier, the current through storage element 34 is set to match reference current BRC as provided by current source 170 of regulator 18.

Figure 7:
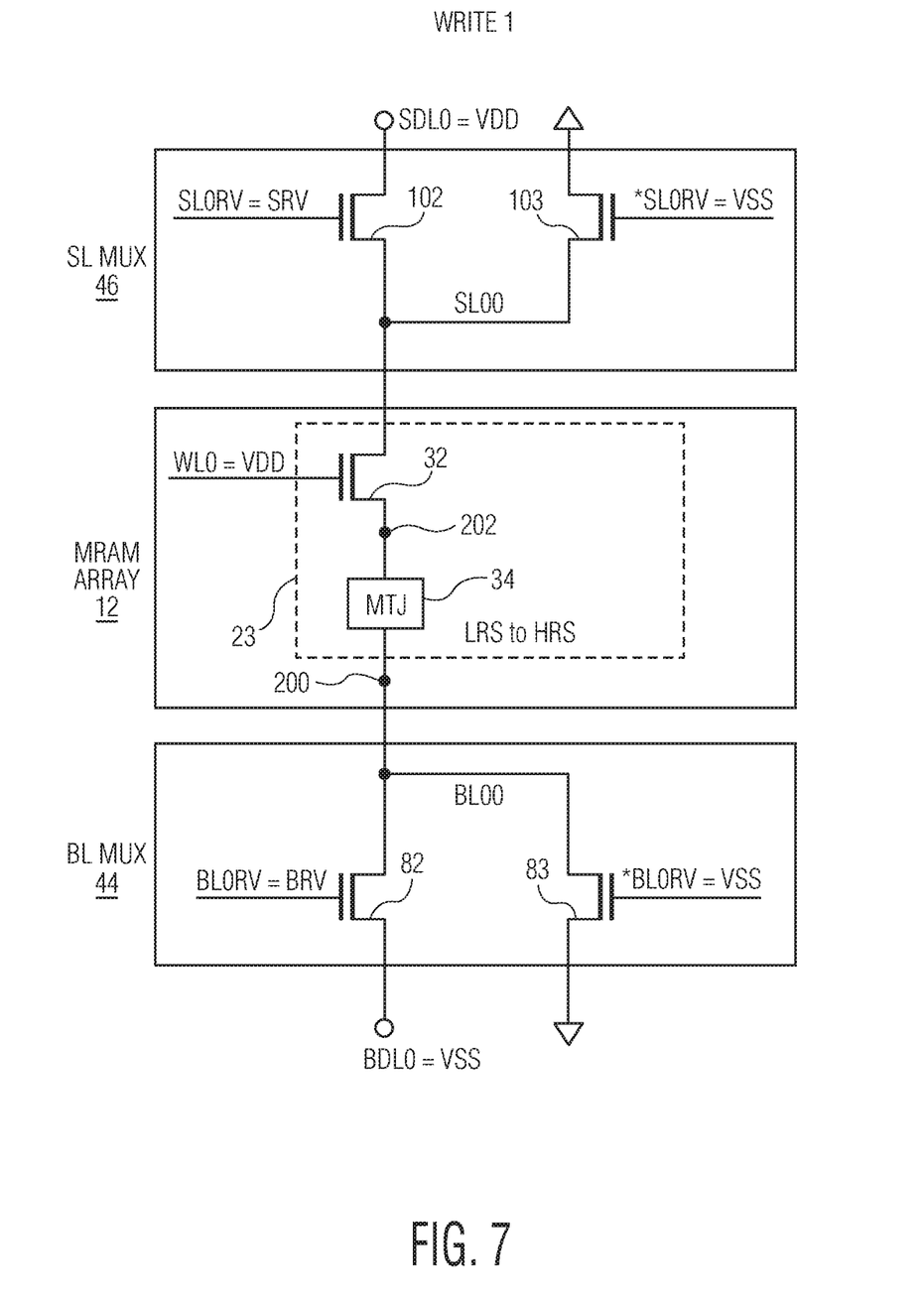
FIG. 7 is a circuit diagram showing voltages applied to nodes during a write operation to a memory cell according to one embodiment of the present invention.

FIG. 7 shows the voltages applied when a "1" is written to memory cell 23. As opposed to the condition of FIG. 6, current is applied in the downward direction (relative to the view of FIG. 7) through storage element 34, and coupling transistor 102 is utilized as a source follower with a regulated voltage SRV. In some instances, prior to being written with a "1", resistive element 34 is in an LRS indicating that a "0" is being stored. To write a "1" value to cell 23 from a "0" value, resistive storage element 34 is placed in an HRS from an LRS. In the embodiment shown, to change the resistive state of an MTJ to an HRS, a high current of 80 uA is provided in the "down" direction (relative to the view of FIG. 7) through the MTJ where node 202 is at a higher voltage than node 200 to change the moments of the MTJ to be anti-parallel. Because the data signal D0 is at a high value (to indicate that a "1" is to be written), a write voltage of VDD is applied to the source data line SDL0 via a close switch 188 of bit line driver circuit 54 and the bit data line BDL0 is grounded by a closed switch 182 of bit line write driver circuit 52 (See FIG. 4). Control signal BL0RV is at a high regulated voltage (BRV) to make transistor 82 conductive to pull node 200 towards ground. Select transistor 32 is made conductive by an asserted word line WL0 (at VDD). Signal SL0RV is at a regulated voltage such that transistor 102 acts as a source follower to set the voltage of node 202 at a value to provide a sufficient current to change the moments of the MJT of storage element 34 to be unaligned. As stated earlier, the current through storage element 34 is set to match reference current SRC as provided by current source 140 of regulator 22.

Figure 8:
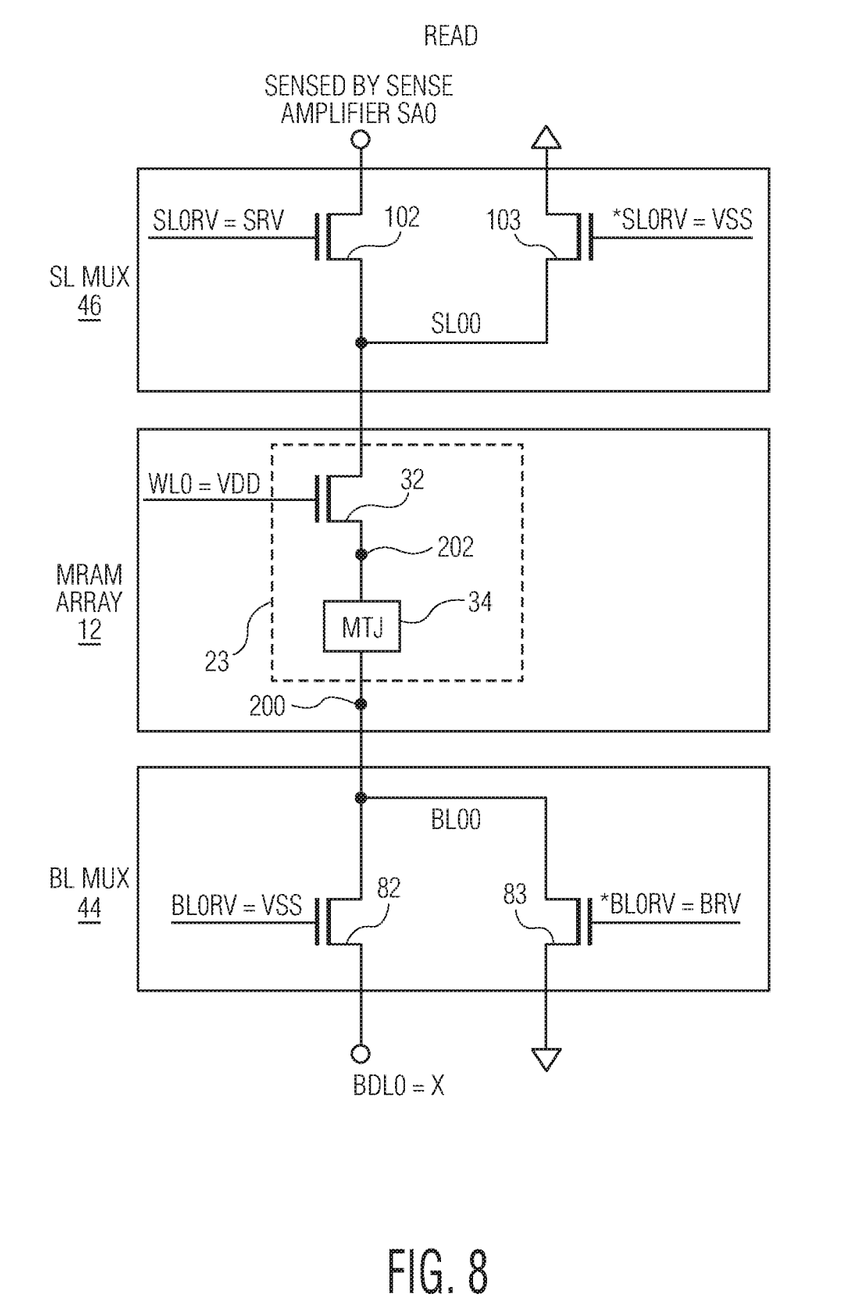
FIG. 8 is a circuit diagram showing voltages applied to nodes during a read operation to a memory cell according to one embodiment of the present invention.

FIG. 8 shows the voltages when memory cell 23 is being read during a memory read operation. During a memory read operation, the resistive state of resistive storage element 34 is determined by sense amplifier 60 which is connected to source data line SDL0 (See FIG. 1). During a read operation, node 200 is grounded by applying a high voltage (BRV) of signal *BL0RV to the gate of grounding transistor 83 to make transistor 83 conductive. Because signal BL0RV is low, transistor 82 is nonconductive such that the voltage of bit data line BDL0 does not affect the read operation (as shown by BDL0=X in FIG. 8). Transistor 102 is made conductive by signal SL0RV being at a high voltage level SRV, and transistor 32 is conductive by word line WL0 being at a high voltage level of VDD such that the resistance value of element 34 can be sense through source data line SDL0, transistor 102, source line SL00, and transistor 32.

Figure 9:
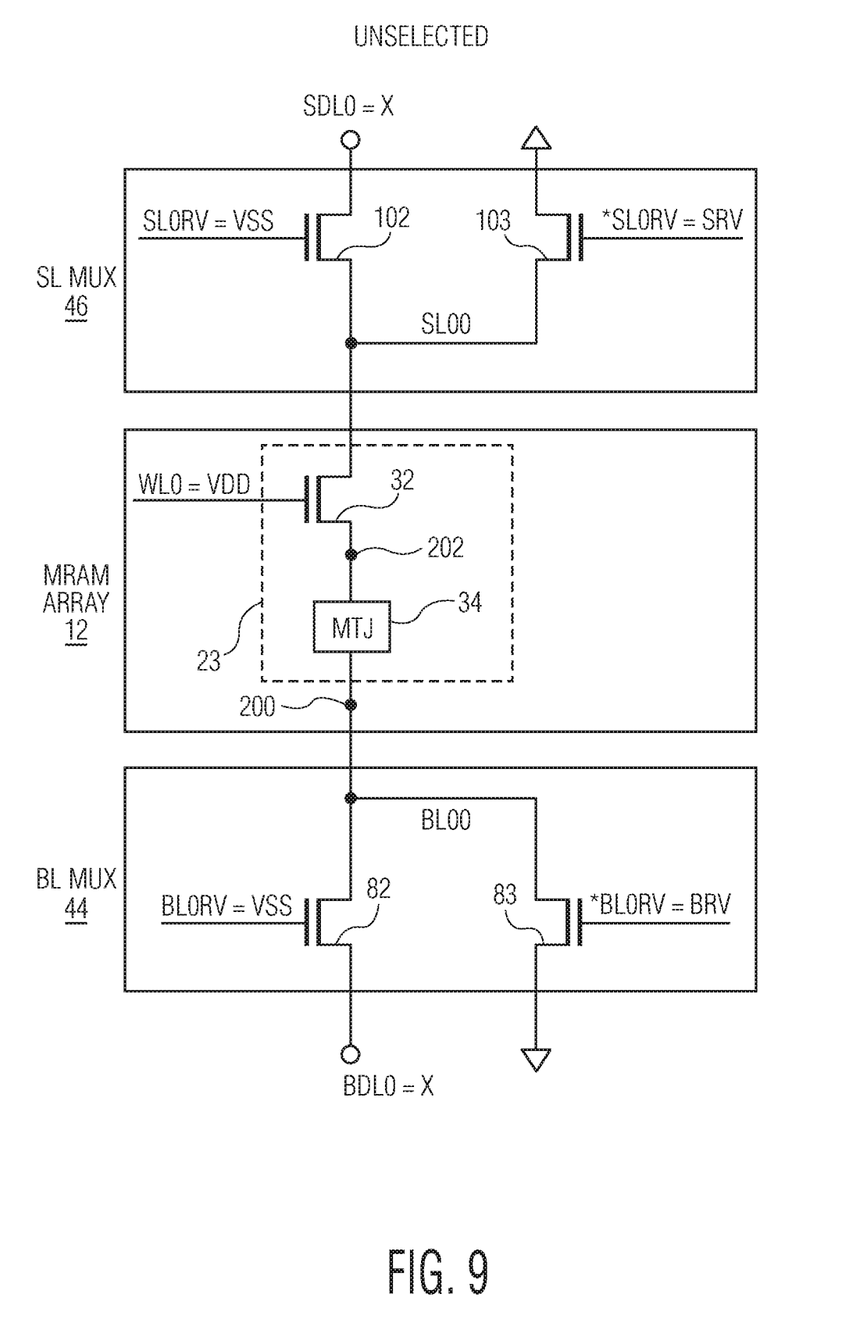
FIG. 9 is a circuit diagram showing voltages applied to nodes coupled to an unselected memory cell during a memory operation according to one embodiment of the present invention.

FIG. 9 shows the voltages when memory cell 23 is in an unselected column of a memory operation (either read or write). In the embodiment shown, cell 23 is in a selected row in that word line WL0 is at an asserted voltage value of VDD. However, the voltages of the other signals would be the same if cell 23 where in an unselected row. Signal *SL0RV is in a high state voltage to ground source line SL00 through transistor 103. Signal *BL0RV is in a high state voltage to ground BL00 through transistor 83. Signals SL0RV and BL0RV are both at a low voltage state to isolate source line SL00 from source data line SDL0 and to isolate bit line BL00 from bit data line BDL0. Note that the voltage conditions of control signals SL0RV, *SL0RV, BL0RV, and *BL0RV may be the same when no memory operation is being performed.

It can be appreciated how the programming current for changing the resistive states of resistive storage elements of selected memory cells of an array can be optimized by using the corresponding column multiplexer transistors as source followers to regulate the voltage at a memory cell node in response to the output of a voltage regulator circuit which is coupled to a replica write circuit including a replica resistive storage element. In some embodiments, because the write current through a resistive storage element is limited or controlled by a regulator circuit with a replica restive storage element, that current can be optimized for writing a data value so that only the necessary current is used, and the resistive storage element is not over-exposed to a higher current. Also, if the replica resistive storage elements (e.g. 133, 141, 162, and 172) are implemented as a trimmable resistors, the resistance of the resistors can be trimmed for the process and temperature effects of the storage elements of the memory cells, which allow for the programming current through a storage element to be optimized across process and temperature variations.

In some embodiments, a mux transistor in the source multiplexer of a column decoder can be used as a source follower for writing one data logic value to the memory cell and a mux transistor in the bit line multiplexer of a column decoder can be used as a source follower for writing another data logic value to the memory cell. Accordingly, with some of these embodiments, the write currents for writing the different logic states can be optimized for the different values.

Furthermore, utilizing the column mux transistors as source follows may reduce the complexity of a memory over a memory that utilizes separate transistors for write current control. In one embodiment, utilizing the column mux transistor as a source follower may aid in controlling the parasitic resistance of the column line in that it reduces the number of series switches utilized.

In one embodiment, a memory includes a memory array of resistive memory cells. Each resistive memory cell of the array including a select transistor and resistive storage element for storing a value. Each resistive memory cell is coupled to a first column line of a plurality of first column lines. The memory includes a first decoder configured to select a set of first column lines from the plurality of first column lines for a memory operation to a selected set of the resistive memory cells coupled to the set of first column lines. The memory includes a first column line multiplexer (MUX) for coupling each selected first column line of the set of first column lines to a corresponding first data line of a plurality of first data lines via a plurality of corresponding first MUX transistors each having a first current electrode coupled to a first column line of the set and a second current electrode coupled to a corresponding first data line of the plurality of first data lines. The memory includes a first voltage regulator for providing a first regulated voltage to control electrodes of the corresponding first MUX transistors during a write operation. The first voltage regulator includes a first write replica circuit including a first replica resistive storage element. The first voltage regulator includes a first regulator circuit including a first input coupled to a first node of the first write replica circuit and an output to provide the first regulated voltage.

In another embodiment, a memory is coupled to a first power supply terminal and a second power supply terminal in which the first power supply terminal receives a higher power supply voltage than the second power supply terminal. The memory includes a memory array of resistive memory cells, each resistive memory cell of the array including a select transistor and a resistive storage element for storing a value. Each resistive memory cell is coupled between a bit line of a plurality of bit lines and a source line of a plurality of source lines. The memory includes a bit line decoder configured to select a set of bit lines from the plurality of first bit lines for a write operation to a selected set of the resistive memory cells. The memory includes a bit line multiplexer (BLMUX) for coupling each selected bit line of the selected set of bit lines to a corresponding bit line data line via a corresponding BLMUX transistor having a first current electrode coupled to a corresponding resistive memory cell of the selected set of the resistive memory cells and a second current electrode coupled to the corresponding bit line data line. The memory includes a first voltage regulator for providing a first regulated voltage to control electrodes of the corresponding BLMUX transistors during a write operation. The first voltage regulator includes a first write replica circuit. The first write replica circuit being a replica of a first write path of the memory. The first write replica circuit includes a first replica select transistor and a first replica resistive storage element, in which the first replica resistive storage element has a resistance value which matches a high resistance value. The first voltage regulator includes a first reference current path and a first regulator circuit including a first input coupled to a first node of the first write replica circuit, a second input coupled to a second node of the first reference current path, and an output to provide the first regulated voltage. The memory includes a source line decoder configured to select a set of source lines from the plurality of source lines for the write operation to the selected set of the resistive memory cells. The memory includes a source line multiplexer (SLMUX) for coupling each selected source line of the selected set of source lines to a corresponding source line data line via a corresponding SLMUX transistor having a first current electrode coupled to a corresponding resistive memory cell of the selected set of the resistive memory cells and a second current electrode coupled to the corresponding source line data line. The memory includes a second voltage regulator for providing a second regulated voltage to control electrodes of the corresponding SLMUX transistors during the write operation. The second voltage regulator includes a second write replica circuit. The second write replica circuit being a replica of a second write path of the memory, wherein the second write replica circuit includes a second replica select transistor and a second replica resistive storage element, in which the second replica resistive storage element has a resistance value which matches a low resistance value. The second voltage regulator includes a second reference current path and a second regulator circuit including a first input coupled to a third node of the second write replica circuit, a second input coupled to a fourth node of the second reference current path, and an output to provide the second regulated voltage.

While particular embodiments of the present invention have been shown and described, it will be recognized to those skilled in the art that, based upon the teachings herein, further changes and modifications may be made without departing from this invention and its broader aspects, and thus, the appended claims are to encompass within their scope all such changes and modifications as are within the true spirit and scope of this invention.

What is claimed is:

1. A memory comprising:
a memory array of resistive memory cells, each resistive memory cell of the array including a select transistor and a resistive storage element for storing a value, wherein each resistive memory cell is coupled to a first column line of a plurality of first column lines;
a first decoder configured to select a set of first column lines from the plurality of first column lines for a memory operation to a selected set of the resistive memory cells coupled to the set of first column lines;
a first column line multiplexer (MUX) for coupling each selected first column line of the set of first column lines to a corresponding first data line of a plurality of first data lines via a corresponding first MUX transistor having a first current electrode coupled to the each selected first column line of the set and a second current electrode coupled to the corresponding first data line of the plurality of first data lines;
a first voltage regulator for providing a first regulated voltage to control electrodes of the corresponding first MUX transistors during a write operation, wherein the first voltage regulator includes:
a first write replica circuit including a first replica resistive storage element;
a first regulator circuit including a first input coupled to a first node of the first write replica circuit and an output to provide the first regulated voltage;
wherein during a memory write operation:
each corresponding first MUX transistor coupled to a memory cell being written to a first resistive state is utilized as a source follower to control a voltage of a node of a resistive storage element of the memory cell;
each corresponding first MUX transistor coupled to a memory cell being written to a second resistive state is not utilized as a source follower to control a voltage of a node of the resistive storage element of the memory cell.

2. The memory of claim 1, wherein each of the first column lines of the plurality of first column lines is characterized as a bit line.

3. The memory of claim 1, wherein:
wherein the resistive memory cells are in a high resistance state when storing of first logical value and in a low resistance state when storing a second logical value;
the memory array is coupled to a first power supply terminal and a second power supply terminal in which the first power supply terminal receives a higher power supply voltage than the second power supply terminal;
the first data lines corresponding to the selected first column lines which are coupled to resistive memory cells of the selected set of resistive memory cells which are being written to the low resistance state, are coupled to the first power supply voltage terminal; and
the first data lines corresponding to the selected first column lines which are coupled to resistive memory cells of the selected set of resistive memory cells which are being written to the high resistance state, are coupled to the second power supply voltage terminal.

4. The memory of claim 3, wherein the first replica resistive storage element includes has a resistance value which is equivalent to the high resistance state.

5. The memory of claim 3, wherein, in the first voltage regulator:
the first write replica circuit includes a first replica select transistor in which the first replica resistive storage element is located between the first node of the first write replica circuit and the first replica select transistor, and the first replica select transistor is located between the first replica resistive storage element and the second power supply terminal.

6. The memory of claim 1, wherein each of the first column lines of the plurality of first column lines is characterized as a source line.

7. The memory of claim 1, wherein:
wherein the resistive memory cells are in a high resistance state when storing of first logical value and in a low resistance state when storing a second logical value;
the memory array is coupled to a first power supply terminal and a second power supply terminal in which the first power supply terminal receives a higher power supply voltage than the second power supply terminal;
the first data lines corresponding to the selected first column lines which are coupled to resistive memory cells of the selected set of resistive memory cells which are being written to the low resistance state, are coupled to the second power supply voltage terminal; and
the first data lines corresponding to the selected first column lines which are coupled to resistive memory cells of the selected set of resistive memory cells which are being written to the high resistance state, are coupled to the first power supply voltage terminal.

8. The memory of claim 7, wherein the first replica resistive storage element has a resistance value which is equivalent to the low resistance state.

9. The memory of claim 7, wherein, in the first voltage regulator:
the first write replica circuit includes a first replica select transistor in which the first replica resistive storage element is located between the first node and the second power supply terminal, and the first node is located between the first replica select transistor and the first replica resistive storage element.

10. The memory of claim 1, wherein each resistive memory cell is coupled to a second column line of a plurality of second column lines, the memory further comprising:
a second decoder configured to select a set of second column lines from the plurality of second column lines for the write operation to the selected set of the resistive memory cells;
a second column line multiplexer (MUX) for coupling each selected second column line of the set of second column lines to a corresponding second data line of a plurality of second data lines via a corresponding second MUX transistor each having a first current electrode coupled to the each selected second column line of the set of second column lines and a second current electrode coupled to the corresponding second data line of the plurality of second data lines;
a second voltage regulator for providing a second regulated voltage to control electrodes of the corresponding second MUX transistors during the write operation, wherein the second voltage regulator includes:
a second write replica circuit, including a second replica resistive storage element, and
a second regulator circuit including a first input coupled to a second node of the second write replica circuit and an output to provide the second regulated voltage.

11. The memory of claim 10, wherein each of the first column lines of the plurality of first column lines is characterized as a bit line and each of the second column lines of the plurality of second column lines is characterized as a source line.

12. The memory of claim 10, wherein the resistive memory cells are in a high resistance state when storing of first logical value and in a low resistance state when storing a second logical value, the first replica resistive storage element has a resistance value equivalent to the high resistance state and the second replica resistive storage element has a resistance value equivalent to the low resistance state.

13. The memory of claim 12, wherein the first replica element has a resistance value which matches the high resistance value, and the second replica element has a resistance value which matches the low resistance value.

14. The memory of claim 12, wherein
in the first voltage regulator:
the first write replica circuit includes a first replica select transistor in which the first replica resistive storage element is located between the first node of the first write replica circuit and the first replica select transistor, and the first replica select transistor is located between the first replica resistive storage element and a lower voltage power supply terminal, and
in the second voltage regulator:
the second write replica circuit includes a second replica select transistor in which the second replica resistive storage element is located between the second node of the second write replica circuit and the second power supply terminal, and the second node is located between the second replica select transistor and the second replica resistive element.

15. The memory of claim 1 wherein the first regulator circuit includes charge pump for providing the first regulated voltage during the write operation.

16. The memory of claim 1 wherein the first voltage regulator includes a first reference current path including a first reference current source, the first regulator circuit includes a second input coupled to a second node of the first reference current path.

17. A memory comprising:
a memory array of resistive memory cells, each resistive memory cell of the array including a select transistor and a resistive storage element for storing a value, wherein each resistive memory cell is coupled to a first column line of a plurality of first column lines;
a first decoder configured to select a set of first column lines from the plurality of first column lines for a memory operation to a selected set of the resistive memory cells coupled to the set of first column lines;
a first column line multiplexer (MUX) for coupling each selected first column line of the set of first column lines to a corresponding first data line of a plurality of first data lines via a corresponding first MUX transistor having a first current electrode coupled to the each selected first column line of the set and a second current electrode coupled to the corresponding first data line of the plurality of first data lines;
a first voltage regulator for providing a first regulated voltage to control electrodes of the corresponding first MUX transistors during a write operation, wherein the first voltage regulator includes:
a first write replica circuit including a first replica resistive storage element;
a first regulator circuit including a first input coupled to a first node of the first write replica circuit and an output to provide the first regulated voltage;
wherein the first regulator circuit includes charge pump for providing the first regulated voltage during the write operation;
wherein the memory is coupled to a first power supply terminal and a second power supply terminal in which the first power supply terminal receives a higher power supply voltage than the second power supply terminal, wherein the first voltage regulator includes a transistor having a first current electrode coupled to the first power supply terminal, a second current electrode coupled to the first node of the first write replica circuit, and a control electrode coupled to receive the first regulated voltage during the write operation.

18. The memory of claim 17 wherein during a memory write operation:
each corresponding first MUX transistor coupled to a memory cell being written to a first resistive state is utilized as a source follower to control a voltage of a node of a resistive storage element of the memory cell;
each corresponding first MUX transistor coupled to a memory cell being written to a second resistive state is not utilized as a source follower to control a voltage of a node of the resistive storage element of the memory cell.

* * * * *